US009625526B2

(12) United States Patent
Priel et al.

(10) Patent No.: US 9,625,526 B2
(45) Date of Patent: Apr. 18, 2017

(54) METHOD AND APPARATUS FOR SCAN CHAIN DATA MANAGEMENT

(71) Applicants: Michael Priel, Netanya (IL); Dan Kuzmin, Givat Shmuel (IL); Sergey Sofer, Rishon Lezion (IL)

(72) Inventors: Michael Priel, Netanya (IL); Dan Kuzmin, Givat Shmuel (IL); Sergey Sofer, Rishon Lezion (IL)

(73) Assignee: NXP USA, INC., Austin, TX (US)

( * ) Notice: Subject to any disclaimer, the term of this patent is extended or adjusted under 35 U.S.C. 154(b) by 100 days.

(21) Appl. No.: 14/650,318

(22) PCT Filed: Jan. 7, 2013

(86) PCT No.: PCT/IB2013/050122
§ 371 (c)(1),
(2) Date: Jun. 8, 2015

(87) PCT Pub. No.: WO2014/106780
PCT Pub. Date: Jul. 10, 2014

(65) Prior Publication Data
US 2015/0331047 A1    Nov. 19, 2015

(51) Int. Cl.
*G01R 31/28* (2006.01)
*G01R 31/3185* (2006.01)
(Continued)

(52) U.S. Cl.
CPC ............ *G01R 31/318575* (2013.01); *G01R 31/318536* (2013.01); *G01R 31/318555* (2013.01);
(Continued)

(58) Field of Classification Search
CPC ........ G01R 31/318575; G01R 31/3177; G01R 31/8555; G06F 3/064; G06F 3/0653; G06F 3/0673
See application file for complete search history.

(56) References Cited

U.S. PATENT DOCUMENTS

| 7,376,039 B2 | 5/2008 | Choi et al. |
| 7,392,447 B2 | 6/2008 | Tang et al. |

(Continued)

FOREIGN PATENT DOCUMENTS

| WO | 2008129362 | 10/2008 |
| WO | 2011154778 | 12/2011 |
| WO | 2012017269 | 2/2012 |

OTHER PUBLICATIONS

Yang et al., Reliable state retention-based embedded processors through monitoring and recovery, Dec. 2011, IEEE Trans. on Computer-aided design on IC & Sys., vol. 30, No. 12, pp. 1773-1785.*

(Continued)

*Primary Examiner* — Shelly A Chase

(57) ABSTRACT

Processing logic circuit has State Retention Power Gating logic circuit including at least two scan chains having different lengths and operable to collect state information about at least a portion of the processing logic circuit before the at least a portion of the processing logic circuit is placed from a first state into a second, different, state. The processing logic circuit includes a memory operable to store collected state information about the at least a portion of the processing logic circuit, and logic circuit operable to rearrange the collected state information data for scan chains shorter than a longest scan chain, to enable valid return of the collected state information data, for the scan chains shorter than a longest scan chain, to the at least a portion of (Continued)

the processing logic circuit when the at least a portion of the processing logic circuit returns to the first state.

17 Claims, 8 Drawing Sheets

(51) Int. Cl.
    *G06F 3/06*     (2006.01)
    *G06F 1/32*     (2006.01)

(52) U.S. Cl.
    CPC ............ *G06F 1/3203* (2013.01); *G06F 3/064* (2013.01); *G06F 3/0625* (2013.01); *G06F 3/0653* (2013.01); *G06F 3/0673* (2013.01)

(56) References Cited

U.S. PATENT DOCUMENTS

| | | | |
|---|---|---|---|
| 2008/0256551 A1 | 10/2008 | Priel et al. | |
| 2009/0326854 A1 | 12/2009 | Chakravadhanula et al. | |
| 2010/0019837 A1* | 1/2010 | Rozen ................. | G06F 1/3203 327/544 |

OTHER PUBLICATIONS

Yang et al., Scan based methodology for reliable state retention power gating design, 2010, IEEE, pp. 69 to 74.*
International Search Report and Written Opinion correlating to PCT/IB2013/050122 issued on Sep. 27, 2013.

* cited by examiner

METHOD AND APPARATUS FOR SCAN CHAIN DATA MANAGEMENT

FIELD OF THE INVENTION

This invention relates to computing systems in general, and in particular to a method and apparatus for Scan Chain Data Management.

BACKGROUND OF THE INVENTION

In order to reduce power consumption of modern Integrated Circuits (ICs), many ICs now include the ability to turn off unused portions of the IC. However, to ensure the respective portion(s) of the IC are able to quickly return to their fully operational state, particularly the exact logical state the portion(s) of the IC were in prior to them being powered down, certain state parameters are stored in a local memory. These stored state parameters are then loaded back into the IC portion(s), immediately after those portion(s) have been powered up again, so that the respective portion(s) of the IC may carry on from where they were before. A form of this process is often referred to as State Retention Power Gating.

The State Retention Power Gating (SRPG) technique is still one of the most aggressive power management techniques, because it allows the gating (i.e. turning off) of the power supply to the respective portion(s) of the IC, and thus saves power wastage/loss through leakage currents and the like, whilst still enabling the IC portion to get back into its previous logical state.

Leakage currents (e.g. the leakage within the well of a transistor) are increasing, as the dimensions of the transistors, and the like, that form ICs get smaller with each iteration of the semiconductor manufacturing process.

Originally, SRPG was intended to be implemented using specially provided Flip Flop (FF) circuitry (i.e. retention latches), so that the state data may be stored local to the respective logic circuit. However, as ICs increased in size, hence requiring increasing amounts of local FF to be provided in an IC, it became less and less efficient to store state data these in retention latches. Thus, it became prevalent to save the state data in a more centralised dedicated SRPG memory, by moving the state data through the scan chains (i.e. test portions of the ICs under test) and out for storage in the centralised SRPG memory.

SUMMARY OF THE INVENTION

The present invention provides a processing logic circuit for use in a computing system, and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
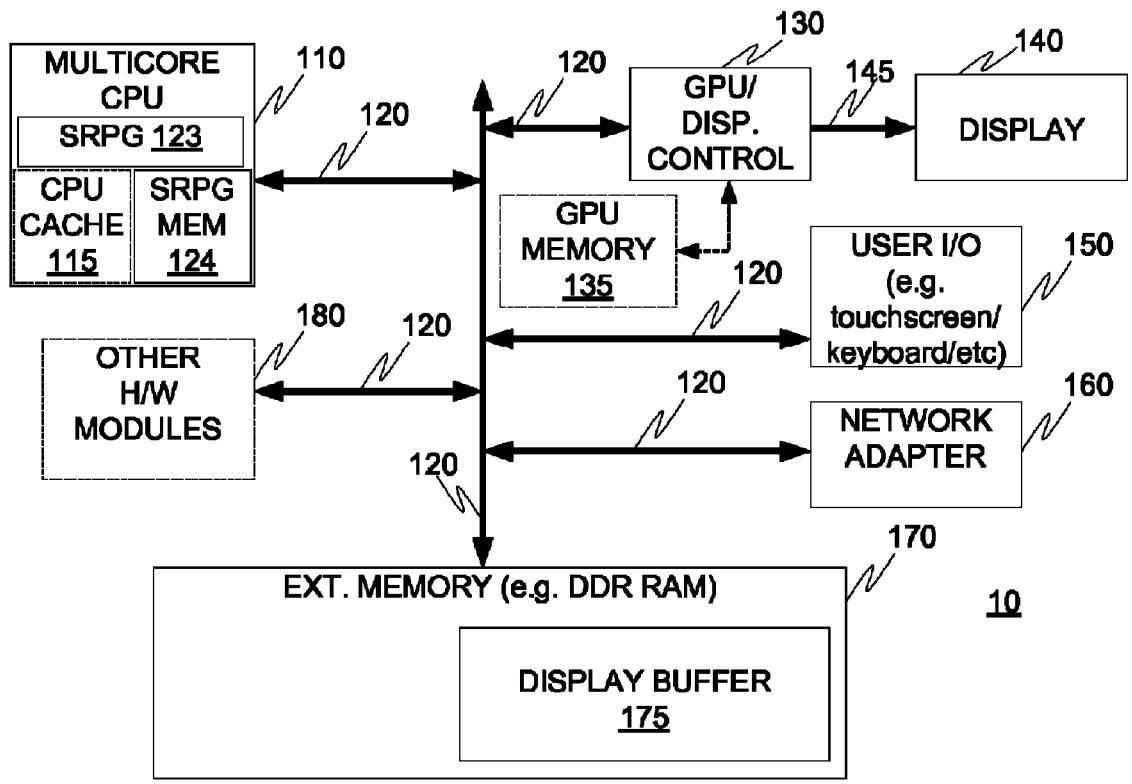
FIG. 1 shows a schematic diagram of a first discrete processor based example computing system to which the invention may apply.

Because the illustrated embodiments of the present invention may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

A problem with the existing approach of storing the state data in a centralised SRPG memory is that either the scan chains must all be of the same length, or some complexity must be added to the SRPG clock gating (i.e. sampling control/timing circuitry, usually in the form of extra clock gating circuitry, i.e. leading to a much more complicated clock tree design across the whole SRPG enable IC) or the shorter scan chains must be artificially lengthened (by adding further scan chain flip flops to all shorter scan chains), thereby making all the scan chains the same length (as the previous longest scan chain). Any which way, extra logic circuits are added en-masse to the overall IC design, and therefore this leads to increased semiconductor die area use (which adds costs, increases manufacturing error rate and can potentially increase the IC's power draw in use, amongst other detrimental things).

In a typical IC design, for example a processor or System on Chip (SoC), and for many various reasons, up to 20-30% of scan chains can be shorter than a predefined longest length of scan chain in use in the respective IC.

There is provided a processing logic circuit (e.g. IC—Integrated Circuit) for use in a computing system, wherein the processing logic circuit has a State Retention Power Gating logic circuit comprising at least two scan chains having different lengths and operable to collect state information about at least a portion of the processing logic circuit before the at least a portion of the processing logic circuit is placed from a first state into a second, different, state, said processing logic circuit comprising a memory coupled to the State Retention Power Gating logic circuit and operable to store a collected state information about the at least a portion of the processing logic circuit, and logic circuit coupled to the memory and operable to rearrange the collected state information data for scan chains shorter than a longest scan chain within the at least a portion of the processing logic circuit, to enable valid return of the collected state information data, for the scan chains shorter than a longest scan chain, to the at least a portion of the processing logic circuit when the at least a portion of the processing logic circuit returns to the first state.

The second, different, state may be either a state in which the at least a portion of the processing logic circuit is in a different context or is in a lower power state (e.g. powered off).

The logic circuit coupled to the memory may comprise a processing unit within a same or another portion of the processing logic circuit that is to be placed into the second, different, state.

The processing unit may be a main central processing unit, CPU, or another CPU within the processing logic circuit.

The rearrangement of the collected state data for scan chains shorter than the longest scan chain may comprise moving invalid state data collected during a SRPG state data storing process from one end of the data structure comprising the state data to another end of the data structure.

The collected state information data may be stored in a FIFO memory data structure and the stored collected state information data may be rearranged by placing invalid state information data for a shorter scan chain at an end of the FIFO memory that is loaded first back into the at least a portion of the processing logic circuit.

The processing logic circuit may be a processor for a computing system or a System on Chip.

The memory coupled to the State Retention Power Gating logic circuit may be a part of the at least a portion of the processing logic circuit to be placed from a first state into a second different state, and the processing logic circuit further comprises further logic circuit to reset the at least a portion of the processing logic circuit containing the memory. The at least a portion of the processing logic circuit may comprise any SRPG enabled module(s) or portion(s) of the processing logic circuit.

There is also provided a method of scan chain data management in processing logic circuit, wherein the processing logic circuit has State Retention Power Gating logic circuit comprising at least two scan chains having different lengths and operable to collect state information about at least a portion of the processing logic circuit before the at least a portion of the processing logic circuit is placed from a first state into a second, different, state, said method comprising collecting state information about at least a portion of the processing logic circuit before the at least a portion of the processing logic circuit is placed from a first state to a second, different, state, and rearranging the collected state information data for the scan chains shorter than a longest scan chain, to enable valid return of the collected state information data for the shorter scan chains to the at least a portion of the processing logic circuit when the at least a portion of the processing logic circuit returns to the first state.

The second, different, state may be a state in which the at least a portion of the processing logic circuit is in a different context or is in a lower power state The method may further comprise using a processing unit within a same or another portion of the processing logic circuit that is to be placed into the second, different, state.

The method may further comprise using a processing unit that is a main central processing unit, CPU, or another CPU within the processing logic circuit.

The method may include rearranging the collected state data for scan chains shorter than the longest scan chain comprises moving invalid data collected during a SRPG state data storing process from one end of the data structure comprising the state data to another end of the data structure.

The method may further comprise storing the collected state information data in a FIFO memory data structure and rearranging the stored collected state information data by placing invalid state information data for a shorter scan chain at an end of the FIFO memory that is loaded first back into the at least a portion of the processing logic circuit.

The method may further comprise collecting state information using a memory coupled to the State Retention Power Gating logic circuit that is part of the at least a portion of the processing logic circuit to be placed from a first state into a second different state, and resetting the at least a portion of the processing logic circuit prior to or at a same time as rearranging the data. The method may further comprise applying the method to any SRPG enabled module(s) or portion(s) of the processing logic circuit.

Thus, examples of the present invention provide a method and apparatus for managing scan chain data, that uses rearrangement of the scan chain data after the SRPG data has been loaded into the SRPG memory, so that, when read out again, it ends up in the right order, and providing the correct data to the respective portions of the IC (i.e. e.g. processing logic circuit). Examples may provide correct SRPG operation without adding substantial extra circuitry to each (otherwise shorter) scan chain, or the clocking gating thereof.

The SRPG memory may be located in any suitable memory of (or location in) the IC having SRPG capability, for example in the external system memory (e.g. DDR Ram, Rambus, or the like), or in a memory local (for example formed on the same semiconductor die or on closely coupled die(s) when the SRPG IC is formed as a system in package (SiP), or the like) to the processing logic circuit for which the SRPG is provided. This local memory may take the form of a suitable amount of on-die DRAM (e.g. DDR RAM), Static RAM, or any functionally equivalent memory storage means that may be incorporated on to a, or the same, semiconductor die(s) as the processing logic circuit to be provided with SRPG functionality.

The rearrangement may take into account the different length scan chains, so that the data, when read out back (i.e. restored) into the same processing circuitry from which the state data was acquired, ends up with the state data in the correct order, and with valid data therein. This is particularly for all scan chains shorter than the longest scan chain in use.

The rearrangement may be carried out by a dedicated hardware module, or by the main, or any other CPU (central processing Unit) and/or core found within the system, preferably also located on the same semiconductor die (so that the latency until rearrangement starts is as low as possible, and the actual speed of rearrangement may be as high as possible, and the like).

The following examples will be disclosed in the context of a processor having SRPG functionality therein.

FIG. 1 shows a schematic diagram of a first discrete processor based example computing system 10 to which the invention may apply, for example a desktop PC, laptop or the like.

The discrete processor based example (e.g. multimedia) computing system 10 of FIG. 1 comprises a main CPU 110 (which is multicore in this specific example, but the invention is not so limited and may apply to any number of general processing cores within the processor 110), that includes a local (to the) main CPU cache memory 115 (for example level 1 or 2 cache) for temporarily storing data for use by the CPU 110 during its operation. The CPU 110 is also provided with SRPG circuitry 123, which is the circuitry that collects and stores (in the SRPG memory 124) the respective state information used within the processor 110 when processing data according to data processing instructions and the like. The SRPG circuitry includes clock gating circuitry with links into the respective scan chains and the like, and is arranged to store the state parameter data derived from the scan chains in the SRPG memory 124, which, as described above may be any form of suitable data storing memory.

The CPU 110 may be connected to the rest of the computing system 10 by any suitable communications links. For example, by a common bus 120 (as shown), but may also be connected by a set of dedicated links between each entity (e.g. CPU, memory, network adapter, etc) within the computing system 10, or a combination of shared buses for some portions and dedicated links for others. The invention is not limited by the particular form of communications links in use in respective portions of the overall computing system 10. Thus, entities within the computing system are generally able to send and/or receive data to and/or from all other entities within the computing system 10.

In the example shown in FIG. 1, the discrete processor based example (e.g. multimedia) computing system 10 further comprises a GPU/display control unit 130, potentially operatively coupled to a GPU memory 135 either directly (as shown) or via a shared but (not shown). The GPU/display control unit 130 may be a combined entity (as shown in FIG. 1), including both the GPU and the necessary physical links (e.g. line drivers, etc) to the display 140 (e.g. Liquid Crystal Display—LCD, plasma display, Organic Light Emitting Diode—OLED, or the like), or may only include the necessary physical links (e.g. line drivers, etc) to the display 140, for example where there is no actual GPU, and instead the graphics are produced by the CPU 110 potentially in a dedicated graphics rendering mode or similar. This is to say, the discrete processor based example computing system 10 may not include the 'discrete' graphics acceleration provide by having a GPU (where 'discrete' here may not mean separation of the GPU from the CPU in terms of semiconductor die, but may instead mean there is separate dedicated graphic rendering capability). Where a GPU is present, the computing system 10 may further include a dedicated GPU memory 135, for use in processing graphics prior to display. Where such a GPU memory is not present, the GPU (or CPU in graphics mode) may use the external memory 170 instead.

The GPU and/or display adapter 130 may be operably connected to the display 140 via dedicated display interface, 145, to drive said display 140 to show the graphical/video output of the discrete processor based example computing system 10. Examples of suitable dedicated display interfaces include, but are not limited to: HDMI (High Definition Multimedia Interface), DVI (Digital Video Interface) or analog interfaces, or those functionally alike.

The discrete processor based example computing system 10 may further include one or more user input/output (I/O) units 150, for example, to provide connection to, and therefore input from a touchscreen, mouse, keyboard, or any other suitable input device, as well as driving suitable output devices such as speakers, fixed function displays (e.g. 9 segment LCD displays, LED flashing signal lights, and the like). The user I/O unit 150 may, for example, further include or comprise a Universal Serial Bus (USB) controller, Firewire controller, Thunderbolt controller or any other suitable peripheral connection interface, or the like. The discrete processor based example computing system 10 may also further include a network adapter 160, for coupling/connecting the discrete processor based example multimedia computing system 10 to one or more communications networks. For example, WiFi (e.g. IEEE 802.11b/g/n networks), wired LAN (e.g. IEEE 802.3), Bluetooth, 3G/4G mobile communications standards and the like. The computing system 10 may also include any other selection of other hardware modules 180 that may be of use, and hence incorporated into the overall computing system 10. The optional nature of these hardware modules/blocks 180 is indicated by their dotted outlines.

The computing system 10 may also include a main external memory subsystem 170, operatively coupled to each of the other above-described entities, for example, via the shared bus 120. In the context of the present invention, the external memory 170 may also include a portion (either permanently dedicated, or not, but otherwise assigned on boot up) for storing display data ready for display, known as a display buffer 175.

The invention is not limited by any particular form of external memory 170, display 140, User I/O unit 150, network adapter 160, or other dedicated hardware modules 180 present or in use in the future.

Figure 2:
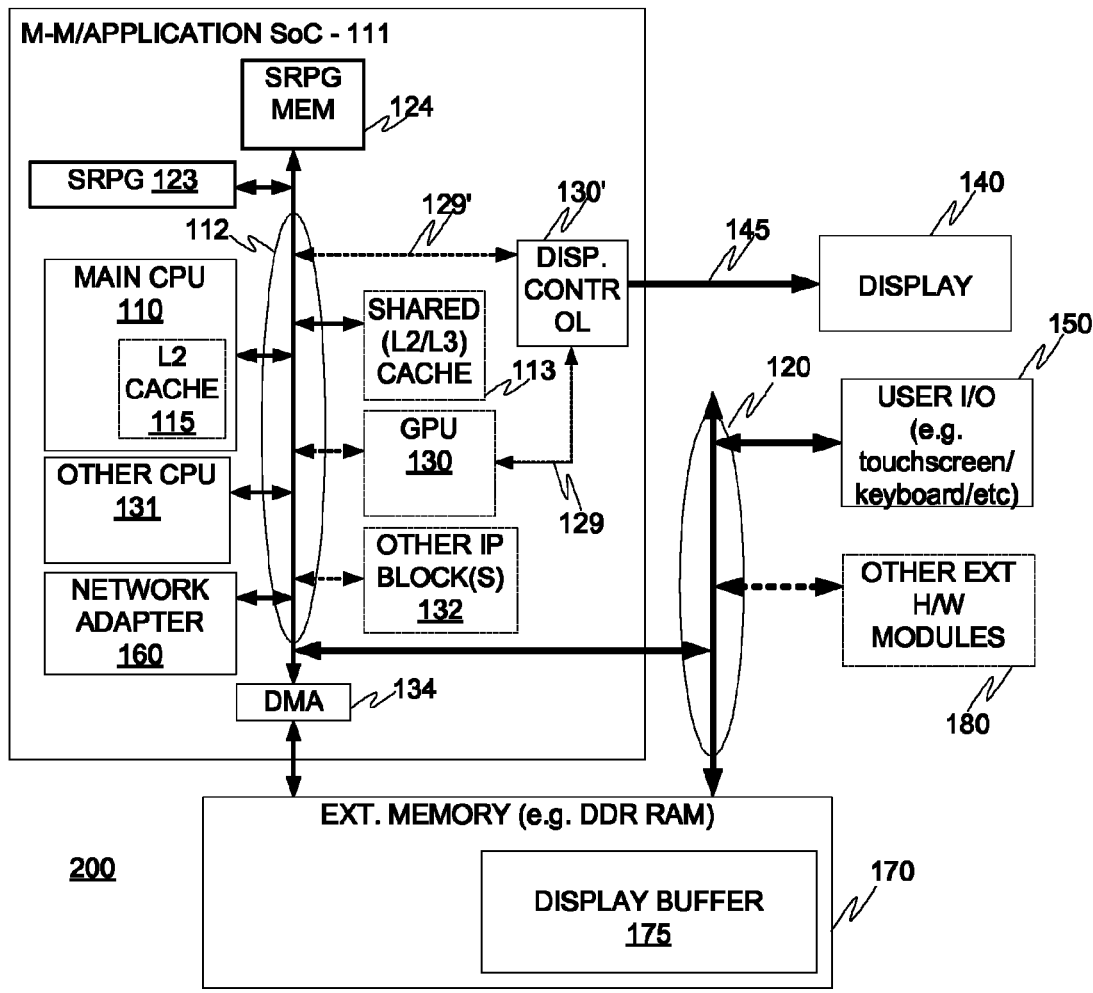
FIG. 2 shows a schematic diagram of a second System on Chip (SoC) integrated multimedia processor based example computing system to which the invention may apply.

FIG. 2 shows a similarly capable computing system to FIG. 1, except that the computing system is formed as a SoC computing system 200, i.e. formed predominantly as a highly integrated multimedia/applications SoC processor 111. In such a situation, more of/most of the overall system is formed within the same IC package (e.g. formed from two or more separate silicon dies, but suitably interconnected within the same package) and/or formed on the same singular integrated circuit semiconductor die itself. However, in this case, some portions of the overall computing system 200 may still be formed from other discrete entities. This form of multimedia computing system is used more often in the portable and/or small form factor device use cases, for example, in the form of laptops, tablet computers, personal media players (PMPs), smartphones/feature phones, etc. However, they also find use in other relatively low cost equipment areas, such as set top boxes, internet appliances and the like.

The majority of the SoC implemented multimedia computing system 200 is very similar to, or indeed the same as for FIG. 1, therefore they use the same references, and they act as described above (e.g. network adapter 160, User I/O 150, etc). This includes the SRPG circuitry, including clock gating circuitry and circuitry that links into the scan chains, arranged for collection of the state parameter data.

However, there are some potential key differences. For example, the SoC 111 may have its own internal bus 112 for operatively coupling each of the entities on the single semiconductor die (again, a shared bus is used in this example, but instead they could equally be one or more dedicated links, or more than a single shared bus, or any other logically relevant/suitable set of communications links) to allow the different entities/portions of the circuit (i.e. integrated entities—CPU 110, Other CPU 131, etc) of the SoC to communicate with each other. A SoC multimedia processor 111 may incorporate more than one CPU for use—thereby allowing multi-processor (e.g. core) data processing, which is a common approach to provide more processing power within a given power (i.e. current/voltage draw/etc) envelope, and without having to keep on increasing CPU operating frequencies. Due to having multiple CPU's on the same semiconductor die, there may be provided some form of shared cache—e.g. shared L2 or L3 cache 113. This shared cache may still be "locked" to a subset of cores/PUs, i.e. only provided for use/access by that subset of cores. The SoC based computing system 200 may include other IP block(s) 132, dependent on the needs/intended uses of the overall system 200, and how the SoC designer provides for those needs/intended uses (e.g. whether he opts to provide dedicated processing resources for a selected operation, or whether he just relies on a general processor instead). In the example of FIG. 2, there is also included a Direct Memory Access (DMA) unit 134, to allow direct access to the external memory 170, and especially, in the context of this invention, the external memory display buffer 175. Another difference to FIG. 1 is the provision of separate GPU 116 and display controller 130' (the use of indicating a different form of display controller, i.e. in this case without GPU).

In FIG. 2, there are two different example internal SoC graphic sub-system setups shown, but the invention is not so limited. These primarily differ in how the respective graphics entities (CPU 110, GPU 116, etc) communicate with each other.

For example, the first may involve the CPU 110 (when operating in some form of (dedicated) graphics mode) or GPU 130 communicating via the internal on-die shared bus 112, particularly including the display control communications portion, 129', i.e. the portion coupling the display control unit 130' to the shared bus 112. The other method may be via a dedicated direct communications link, e.g. link 129 between, for example, the GPU 116 and display control unit 130' (a similar direct communications link is not shown between the CPU 110 and display control unit 130', but this form may equally be used where there is no GPU in the SoC). In the example shown, the display control unit 130' and GPU 116 are integrated onto the same SoC multimedia processor 111, but may equally be formed of one or more discrete unit(s) outside of the SoC semiconductor die, and which is connected by some suitable dedicated or shared interface (not shown).

Regardless of how the CPU/GPU is connected to the display control unit 130', they may also be operatively coupled to the display buffer 175, for example located in the external memory subsystem 170. This so called external memory based display buffer 175 is accessible, in the example shown, via the internal shared bus 120, and the DMA unit 134 connected thereto. In this way, the display data is communicable to the display 140 via the display control unit 130' under control of the CPU 110 and/or GPU 116. The display buffers may also be included in the display adapter (not shown). Also, it will be appreciated that other suitable direct or indirect connections between the respective entities involved in rendering the display may be used, depending on the particular display driver circuitry configuration in use.

Figure 3:
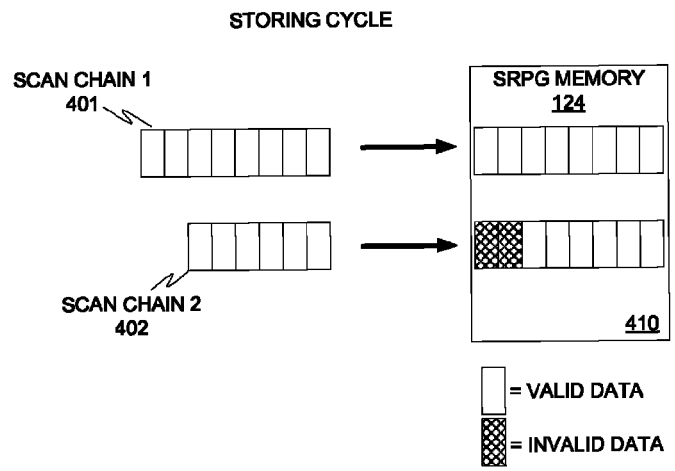
FIG. 3 shows an example of how invalid SRPG state data may be saved to SRPG memory in a storing cycle if there are no dummy units placed in shorter scan chains.

FIG. 3 shows an example of how SRPG state data may be saved to SRPG memory in a storing cycle if there are no dummy units (e.g. extra flip-flops) added to the otherwise shorter scan chains, using a simplistic example with only two scan chains of different lengths. There is shown a first scan chain 401 of a first (longer) length, in this example being 8 units in length, and a second scan chain 402 of shorter length (in this example, 6 units long). When the two scan chain state data is clocked into the SRPG memory 124, in the usual way, there is formed an un-rearranged SRPG memory data set 410. Here, it can be seen that the final two cycles of the SRPG data loaded into SRPG memory for the shorter scan chain's results in invalid data, because that shorter scan chain 402 does not have valid state data to pass to the SRPG memory for those final two cycles (i.e. for the number of cycles by which the scan chain is shorter than the longest scan chain in use in the SRPG).

Figure 4:
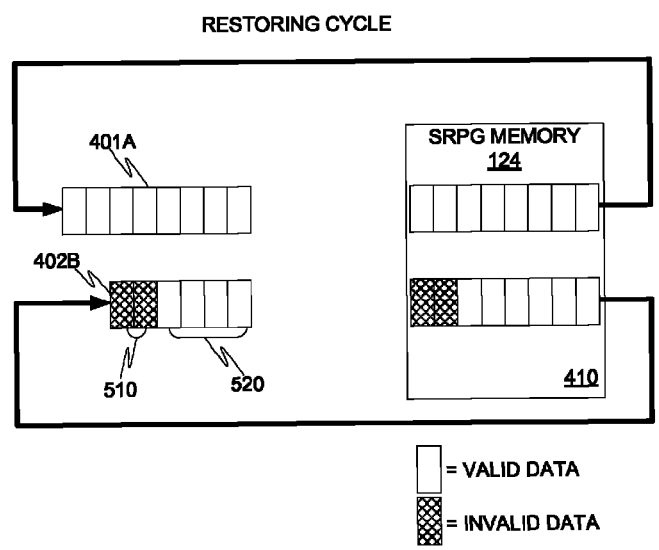
FIG. 4 shows an example of how the invalid SRPG state data as saved in FIG. 4 can be returned in a restoring cycle.

FIG. 4 shows an example of how the SRPG state data as saved in FIG. 4 can be returned in a restoring cycle, and hence cause an invalid returned state 402B for the shorter scan chain, whilst a valid state is returned to the longer scan chain 401A. Here, because the scan chain state data stored in the SRPG memory is restored back into the respective scan chain by circularly clocking the data back in to the respective scan chain, and this occurs in lock step across all the scan chains, and the state data is clocked back into the scan chains until the longest scan chain is suitably restored, the final two portions of the shorter scan chain now have the invalid data restored therein. This is because, without some timing complexity included for the restore process/apparatus, or the insertion of dummy scan chain units, the valid scan data for the shorter scan chain simply cycles back out for the clock cycles that are in excess of the number of restoring clock cycles required for the shorter scan chain. This is to say, the shorter scan chains have valid data at the point in time when the number of restoring clock cycles equals the number of units in the shorter scan chain, but there are still a number of further restoring clock cycles going to happen (since the SRPG data is clocked back to the scan chains in lockstep), which results in the invalid data at the end of the SRPG memory 124 for the shorter scan chain being loaded in to the shorter scan chain.

Figure 5:
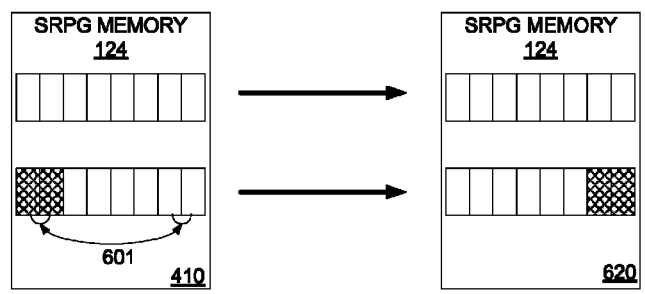
FIG. 5 shows an example rearrangement of the SRPG data stored in a SRPG memory according to an example of the invention.

FIG. 5 shows an example rearrangement of the SRPG data stored in a SRPG memory according to an example of the invention, so that there is no need to include dummy scan chain units (e.g. flip-flops) for the shorter scan chains, or include the further complexity in the clock gating circuitry, e.g. the insertion of "dummy" clock gating signals, or the like. Put simply, the scan chain state data for the shorter scan chain can be re-arranged 601, after the scan state data load-in process into the SRPG memory 124 is complete, to form rearranged scan chain state data 620. This rearrangement 601 is carried out so that the invalid data comes (out) first for the shorter scan chain during the restoring cycle. For example, for a case where the scan chain data is loaded in to and out of a FIFO (First In First Out) style memory/data structure (as shown in the Figures), this rearrangement 601 may comprise moving the invalid data so that it is located at the front of the FIFO memory portion used for storing the state data for the shorter scan chains (i.e. it is the first data to come out of the FIFO memory). However, if a different form of data structure for storing the SRPG data is used, e.g. LIFO, a different rearrangement may be applied. The SRPG data rearrangement 601 may be carried out by any suitable processing unit within the computing system, for example the main CPU or another CPU therein, or may be carried out by some suitable relatively simple and reusable extra processing logic circuit designed into the computing system, and which may be utilised by any and all shorter scan chains, thereby producing a saving on semiconductor die area compared to including a suitable number of dummy scan chain units (for example flip-flops) into the shorter chains, or more complex scan chain data clocking (i.e. timing) circuitry for each of the shorter scan chains.

The rearrangement may be viewed as enabling the valid return of the collected state information data to the at least one portion of the processing logic circuit that enters the different state.

Figure 6:
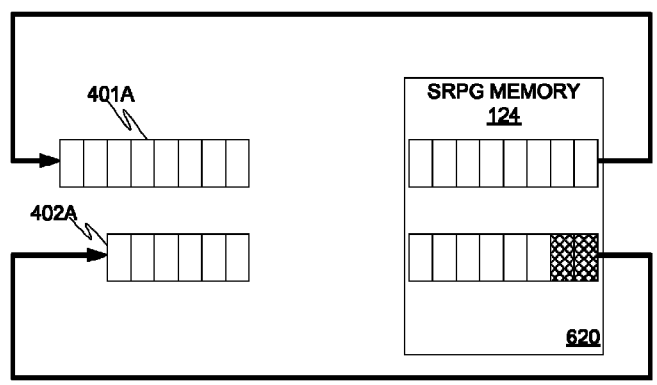
FIG. 6 shows an example of how the rearranged SRPG state data as saved in FIG. 5 can be returned, completely validly, in a restoring cycle.

FIG. 6 shows an example of how the rearranged SRPG state data as saved in FIG. 5 can be returned, completely validly, in a restoring cycle. Here, the longer scan chain has returned to it completely valid data 401A, but so has the shorter scan chain 402A. This has occurred, because the invalid data is read out of the SRPG memory 124 first, and returned to the shorter scan chain, but is subsequently flushed out by the valid data, as the scan chain restore process continues for the requisite number of clock cycles to cover the longer scan chain.

Figure 7:
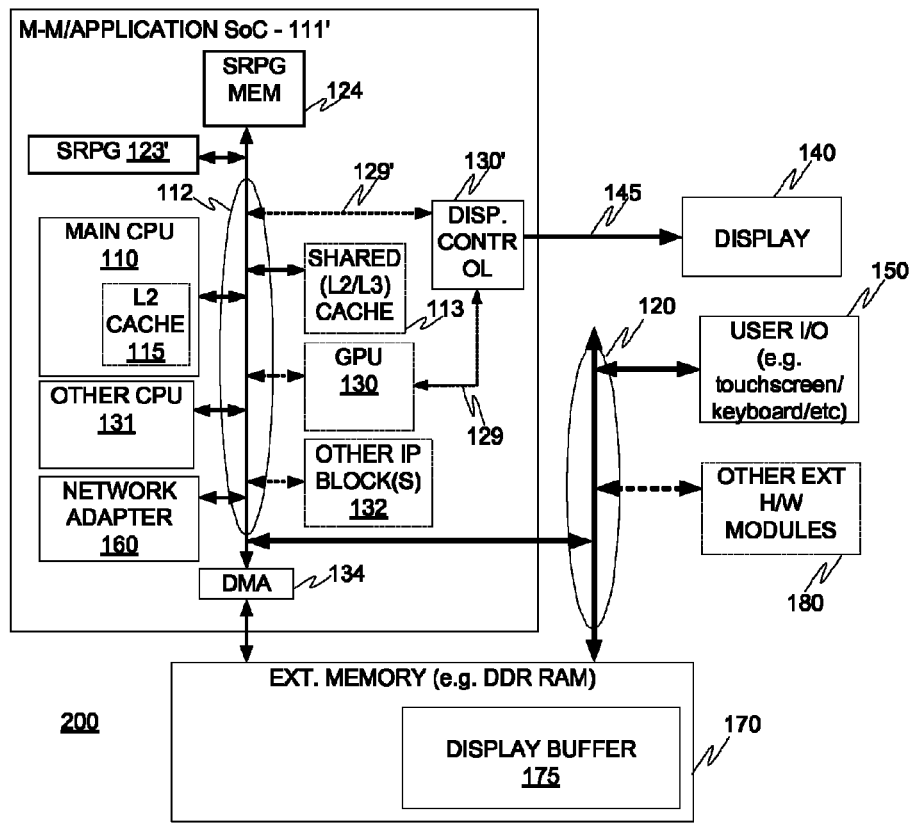
FIG. 7 shows a schematic diagram of an example SoC computing system according to an example of the invention.

FIG. 7 shows a more detailed schematic diagram of an example SoC computing system according to an example of the invention. This example is largely the same as shown in FIG. 2, except that there is a modified SRPG circuit 123', to thereby provide a modified SoC multi-media processor 111'. The modified SRPG is one example implementation of the invention, in that the modified SRPG circuit can be arranged to re-arrange the state data in the SRPG memory 124 as described above. However, other more specific implementations are envisaged, as described below. The invention may also be implemented as tangible and non-transitory software code, for execution on a general processor unit, such as the main CPU and/or an other CPU in the computing system, where applicable.

Figure 8:
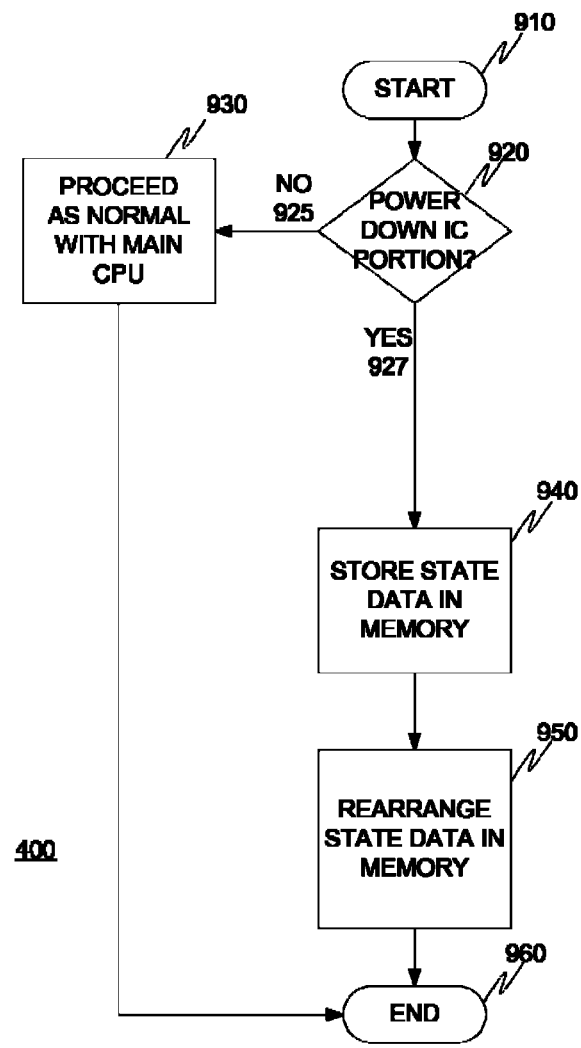
FIG. 8 shows a flow chart of a portion of a method according to an example of the invention.

FIG. 8 shows a flow chart of a portion of a method according to an example of the invention. The method may start at 910 and immediately determine whether to move to a different state (e.g. power down, i.e. place into a lower power state, which may usefully involve the saving of state data—but the invention may also be applied to context changes as well) at least a portion of the overall IC, thereby instigating the saving of the state data for at least that one portion of the IC. The portion to be placed into a different state, e.g. the lower power state, may be any size, up to and including the whole of the IC to which the invention is applied. Multiple, smaller portions may also be put into the different state, e.g. a lower power state, i.e. the invention is not limited to the form or extent of SRPG in use, for context changes and/or power saving techniques. If no portion of the IC is to be placed into a lower power state (i.e. a NO 925 response decision), then the method proceeds with processing as normal 930 and the method ends 960. If there is at least one portion of the IC put into a different state, e.g. being powered down (i.e. a YES, 927 response decision), then the method proceeds to save the state data largely in the usual way 940, but without using any dummy units or clock gating changes. Then the method re-arranges the data in the, for example, SRPG memory 950.

Figure 9:
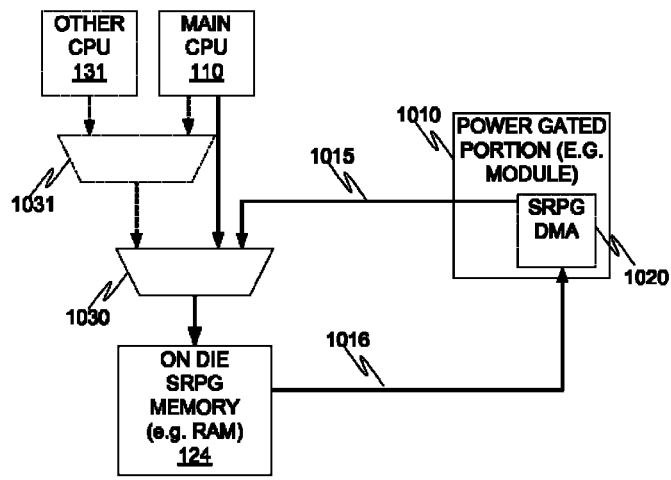
FIG. 9 shows a more detailed schematic diagram of an example of apparatus according to an example of the invention.

FIG. 9 shows a more detailed example of a simple use-case for apparatus according to an example of the invention, for example where the implementation in use stores the SRPG data in another module entirely (i.e. not a module that will be power gated, in this e.g., the on-die RAM). The apparatus according to this example includes the power gate-able portion, e.g. module 1010, which itself includes, for example, a SRPG DMA circuit 1020. The SRPG DMA circuit 1020 is operable to move the state data from the scan chain for the respective module 1010 into the, for example, on-die SRPG memory 124, via the multiplexer 1030. This multiplexer 1030 provides access to the respective portion of the SRPG memory 124, to either the SRPG DMA module (so that the SRPG DMA module can load the state data into the SRPG memory 124), or to the main CPU 110—so that the CPU can carry out the afore-mentioned data rearrangement (according to one example of the invention). There is also shown in dotted outline (to show the optional nature of this embodiment), a further multiplexer 1031, which may be used to select access to the on-die memory by another CPU, e.g. other CPU 131, which may instead carry out the rearrangement of the stat data in SRPG memory 124. This form, i.e. using a further CPU selection means 1031, may be used in embodiments having more than one CPU in particular, so that the method may be applied to all CPUs (e.g. the main CPU can rearrange the SRPG data for an other CPU 131, while the other CPU 131 can rearrange data for the main CPU, etc, when each uses SRPG, respectively).

Figure 10:
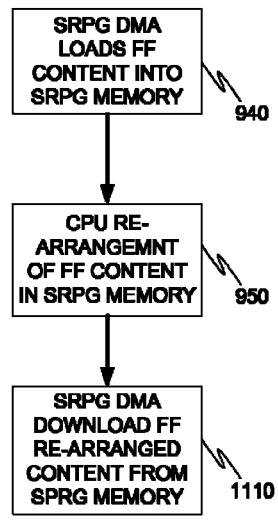
FIG. 10 shows a portion of a method as applicable to the apparatus of FIG. 9, according to an example of the invention.

FIG. 10 shows a portion of a method as applicable to the example apparatus of FIG. 9. The method comprises (once a SRPG technique is decided to be applied) the SRPG DMA circuit 1020 loading the scan chain data 940, e.g. from the scan chain flip-flops, into the SRPG memory 124, followed by a CPU (e.g. main CPU 110 or other CPU 131 of FIG. 9) re-arranging the scan chain data 950 in the SRPG memory 124, and once the respective portion of the IC to which the scan chain relates is re-enabled (e.g. changes back to a first state), the respective re-arranged scan chain data is loaded back into the state flip-flops from the SRPG memory 124.

Figure 11:
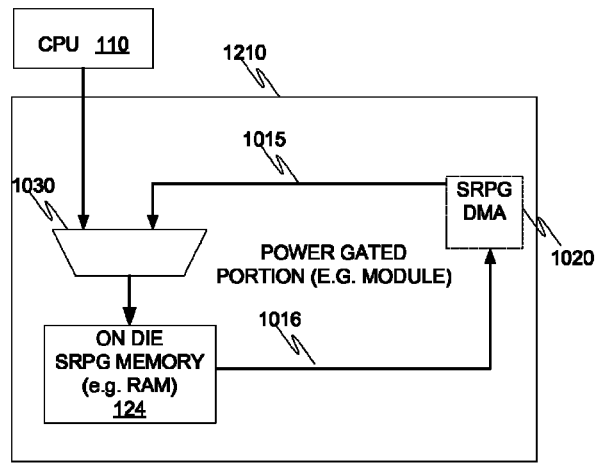
FIG. 11 shows a more detailed schematic diagram of an alternative example of apparatus according to an example of the invention.

FIG. 11 shows a more detailed alternative example of apparatus according to an example of the invention, where the memory is within the same module that is undergoing SRPG. This time, there is only one CPU shown connected through the multiplexer 1030, for clarity (but equally, more than one could be used, as shown in FIG. 9). The most relevant difference here is that even the SRPG memory 124 may be within the power gated module, but this is still a possible example implementation of the invention because a reset state of the module or portion having the SRPG memory 124 in most cases still allows basic functionality such as access to the local memories. As will be appreciated, the SRPG memory may comprise a plurality of smaller memories, i.e. a separate SRPG memory for each SRPG enabled module/unit/portion of the IC.

Figure 12:
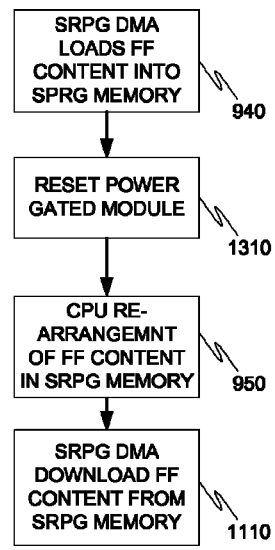
FIG. 12 shows a portion of a method as applicable to the apparatus of FIG. 11, according to an example of the invention.

FIG. 12 shows a portion of a method as applicable to the apparatus of FIG. 11, according to an example of the invention. This method is largely the same as shown in FIG. 10, except there is the additional step of resetting the gate module, 1310, which still allows access to the (local) SRPG memory 124.

Thus, example embodiments of the invention provide an effective yet simple to implement method and apparatus to enable SRPG scan chain data for a plurality of scan chains of different length to be stored to a SRPG memory (local or external to the SRPG enabled module(s)/portion(s) of an IC, or indeed local or external to the SRPG enabled overall IC), all without requiring the use (i.e. having to include onto the semiconductor die) of dummy flip-flops in the scan chains, in order to make them all the same length, or more complexity in the clock gating circuitry, for example for generating 'dummy' cycles, or the like, which complicate the clock gating tree design.

Example portions of the invention may be implemented as a computer program for a computing system, for example multimedia computing system, or processor therein, said computer program for running on the multimedia computer system, at least including executable code portions for creating digital logic circuit that is arranged to perform the steps of any method according to embodiments the invention when run on a programmable apparatus, such as a computer data storage system, disk or other non-transitory and tangible computer readable medium. For example, examples of the invention may take the form of an automated Integrated Circuit design software environment (e.g. CAD/EDA tools), used for designing ICs and SoCs in particular, that may implement the aforementioned and described SRPG data rearrangement invention.

A computer program may be formed of a list of executable instructions such as a particular application program and/or an operating system. The computer program may for example include one or more of: a subroutine, a function, a procedure, an object method, an object implementation, an executable application, an applet, a servlet, a source code, an object code, a shared library/dynamic load library and/or other sequence of instructions designed for execution on a suitable computer system, such as an Integrated Circuit design system.

The computer program may be stored in a non-transitory and tangible fashion, for example, internally on a computer readable storage medium or (after being) transmitted to the computer system via a computer readable transmission medium. All or some of the computer program may be provided on computer readable media permanently, removably or remotely coupled to a programmable apparatus, such as an information processing system. The computer readable media may include, for example and without limitation, any one or more of the following: magnetic storage media including disk and tape storage media; optical storage media such as compact disk media (e.g., CD-ROM, CD-R, Blueray, etc.) digital video disk storage media (DVD, DVD-R, DVD-RW, etc) or high density optical media (e.g. Blueray, etc); non-volatile memory storage media including semiconductor-based memory units such as FLASH memory, EEPROM, EPROM, ROM; ferromagnetic digital memories; MRAM; volatile storage media including registers, buffers or caches, main memory, RAM, DRAM, DDR RAM etc.; and data transmission media including computer networks, point-to-point telecommunication equipment, and carrier wave transmission media, and the like. Embodiments of the invention are not limited to the form of computer readable media used.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to graphics overlay data examples of embodiments of the invention. It will, however, be evident that various modifications and changes may be made therein without departing from the broader scope of the invention as set forth in the appended claims. For example, the method may equally be used to compress data that is not used as much as some other data.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be used, or replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic circuit. In the case of a negative logic circuit signal, the signal is active low where the logically true state corresponds to a logic circuit level zero. In the case of a positive logic circuit signal, the signal is active high where the logically true state corresponds to a logic circuit level one. Note that any of the signals described herein can be designed as either negative or positive logic circuit signals. Therefore, in alternate embodiments, those signals described as positive logic circuit signals may be implemented as negative logic circuit signals, and those signals described as negative logic circuit signals may be implemented as positive logic circuit signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic circuit level one, the logically false state is a logic circuit level zero. And if the logically true state is a logic circuit level zero, the logically false state is a logic circuit level one.

Those skilled in the art will recognize that the boundaries between logic circuit blocks are merely illustrative and that alternative embodiments may merge logic circuit blocks or circuit elements or impose an alternate decomposition of functionality upon various logic circuit blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, tablets, notepads, personal digital assistants, electronic games, automotive and other embedded systems, smart phones/cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Unless otherwise stated as incompatible, or the physics or otherwise of the embodiments prevent such a combination, the features of the following claims may be integrated together in any suitable and beneficial arrangement. This is to say that the combination of features is not limited by the specific form of claims below, particularly the form of the dependent claims, and as such a selection may be driven by claim rules in respective jurisdictions rather than actual intended physical limitation(s) on claim combinations. For example, reference to another claim in a dependent claim does not mean only combination with that claim is envisaged. Instead, a number of claims referencing the same base claim may be combined together.

The invention claimed is:

1. Processing logic circuit for use in a computing system, wherein the processing logic circuit has a State Retention Power Gating logic circuit having at least two scan chains having different lengths and operable to collect state information about at least a portion of the processing logic circuit before the at least a portion of the processing logic circuit is placed from a first state into a second, different, state, said processing logic circuit comprising:
   a memory coupled to the State Retention Power Gating logic circuit and operable to store a collected state information about the at least a portion of the processing logic circuit; and
   a further logic circuit coupled to the memory and operable to rearrange the collected state information data for scan chains shorter than a longest scan chain within the at least a portion of the processing logic circuit, to enable valid return of the collected state information data, for the scan chains shorter than a longest scan chain, to the at least a portion of the processing logic circuit when the at least a portion of the processing logic circuit returns to the first state.

2. The processing logic circuit of claim 1, wherein the second, different, state is a state in which the at least a portion of the processing logic circuit is in a different context or is in a lower power state.

3. The processing logic circuit of claim 1, wherein the further logic circuit coupled to the memory comprises a processing unit within a same or another portion of the processing logic circuit that is to be placed into the second, different, state.

4. The processing logic circuit of claim 3, wherein the processing unit is a central processing unit, CPU, within the processing logic circuit.

5. The processing logic circuit of claim 1, wherein to rearrange the collected state data for scan chains shorter than the longest scan chain comprises moving invalid state data collected during a SRPG state data storing process from one end of the data structure comprising the state data to another end of the data structure.

6. The processing logic circuit of claim 1, wherein the collected state information data is stored in a FIFO memory data structure and the stored collected state information data is rearranged by placing invalid state information data for a shorter scan chain at an end of the FIFO memory that is loaded first back into the at least a portion of the processing logic circuit.

7. The processing logic circuit of claim 1, wherein the processing logic circuit is a processor for a computing system or a System on Chip.

8. The processing logic circuit of claim 1, wherein the memory coupled to the State Retention Power Gating logic circuit is part of the at least a portion of the processing logic circuit to be placed from a first state into a second different state, and the processing logic circuit further comprises further logic circuit to reset the at least a portion of the processing logic circuit containing the memory.

9. The processing logic circuit of claim 1, wherein the at least a portion of the processing logic circuit comprises any SRPG enabled modules or portions of the processing logic circuit.

10. A method of scan chain data management in processing logic circuit, wherein the processing logic circuit has State Retention Power Gating logic circuit having at least two scan chains having different lengths and operable to collect state information about at least a portion of the processing logic circuit before the at least a portion of the processing logic circuit is placed from a first state into a second, different, state, said method comprising:

collecting state information about at least a portion of the processing logic circuit before the at least a portion of the processing logic circuit is placed from a first state to a second, different, state; and rearranging the collected state information data for the scan chains shorter than a longest scan chain, to enable valid return of the collected state information data for the shorter scan chains to the at least a portion of the processing logic circuit when the at least a portion of the processing logic circuit returns to the first state.

11. The method of claim 10, wherein the second, different, state is a state in which the at least a portion of the processing logic circuit is in a different context or is in a lower power state.

12. The method of claim 10, further comprising using a processing unit within a same or another portion of the processing logic circuit that is to be placed into the second, different, state.

13. The method of claim 12, further comprising using a processing unit that is a main central processing unit, CPU, or another CPU within the processing logic circuit.

14. The method of claim 10, wherein rearranging the collected state data for scan chains shorter than the longest scan chain comprises moving invalid data collected during a SRPG state data storing process from one end of the data structure comprising the state data to another end of the data structure.

15. The method of claim 10 further comprising storing the collected state information data in a FIFO memory data structure and rearranging the stored collected state information data by placing invalid state information data for a shorter scan chain at an end of the FIFO memory that is loaded first back into the at least a portion of the processing logic circuit.

16. The method of claim 10, further comprising collecting state information using a memory coupled to the State Retention Power Gating logic circuit that is part of the at least a portion of the processing logic circuit to be placed from a first state into a second different state; and resetting the at least a portion of the processing logic circuit prior to or at a same time as rearranging the data.

17. The method of claim 10, further comprising applying the method to any SRPG enabled modules or portions of the processing logic circuit.

* * * * *